(12) United States Patent
Song et al.

(10) Patent No.: US 11,289,446 B2
(45) Date of Patent: Mar. 29, 2022

(54) MULTIPLE ACTUATOR WIRE BONDING APPARATUS

(71) Applicant: ASM Technology Singapore Pte Ltd, Singapore (SG)

(72) Inventors: Keng Yew Song, Singapore (SG); Yue Zhang, Singapore (SG); Xiao Liang Chen, Singapore (SG); Zheng Yu Lin, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 207 days.

(21) Appl. No.: 15/937,972

(22) Filed: Mar. 28, 2018

(65) Prior Publication Data

US 2019/0304947 A1 Oct. 3, 2019

(51) Int. Cl.
*B23K 20/00* (2006.01)
*H01L 23/00* (2006.01)

(52) U.S. Cl.
CPC ............ *H01L 24/78* (2013.01); *B23K 20/007* (2013.01); *H01L 2224/78823* (2013.01)

(58) Field of Classification Search
None
See application file for complete search history.

(56) References Cited

U.S. PATENT DOCUMENTS

| | | | |
|---|---|---|---|
| 4,475,681 A * | 10/1984 | Ingle | B23K 20/007 228/4.5 |
| 4,808,892 A * | 2/1989 | Dreibelbis | H02K 41/0356 310/12.05 |
| 5,653,375 A | 8/1997 | Nam | |
| 5,699,953 A | 12/1997 | Safabakhsh | 228/110.1 |
| 6,237,833 B1 * | 5/2001 | Ikoma | B23K 31/125 219/85.18 |
| 6,286,749 B1 * | 9/2001 | Lee | B23K 20/004 228/1.1 |
| 7,025,243 B2 | 4/2006 | Wong et al. | 228/4.5 |
| 2004/0188026 A1 * | 9/2004 | Kakutani | B23K 20/004 156/391 |
| 2005/0109815 A1 * | 5/2005 | Kakutani | B23K 20/004 228/9 |

(Continued)

FOREIGN PATENT DOCUMENTS

| CN | 101507089 A | 8/2009 |
|---|---|---|
| TW | 201810469 A | 3/2018 |

OTHER PUBLICATIONS

Taiwanese Office Action, dated Aug. 7, 2019, issued corresponding Taiwanese Patent Application No. 108108548. English translation. Total pp. 26.

*Primary Examiner* — Devang R Patel
(74) *Attorney, Agent, or Firm* — Ostrolenk Faber LLP

(57) ABSTRACT

According to a first aspect of the present invention, there is provided a bond apparatus for bonding a wire to a bonding surface, comprising: a bond head body movably retained by a mounting portion; a first actuator; and a second actuator, wherein the bond head body has a tool portion configured to receive a bonding tool for receiving and bonding the wire and an actuator portion coupled with the first actuator and the second actuator, the first actuator and the second actuator being operative to act on the actuator portion for moving the bond head body with respect to the mounting portion to move the bonding tool with respect to the bonding surface.

17 Claims, 6 Drawing Sheets

(56) References Cited

U.S. PATENT DOCUMENTS

| | | | |
|---|---|---|---|
| 2007/0096568 A1 | 5/2007 | Patt | 310/15 |
| 2008/0308609 A1* | 12/2008 | Felber | B23K 20/007 |
| | | | 228/1.1 |
| 2011/0114703 A1 | 5/2011 | Schmidt-Lange | |
| 2012/0087047 A1* | 4/2012 | Imuta | G11B 5/4873 |
| | | | 360/294 |
| 2016/0023298 A1* | 1/2016 | Song | H01L 24/78 |
| | | | 228/1.1 |
| 2019/0279957 A1 | 9/2019 | Uchida | |

* cited by examiner

MULTIPLE ACTUATOR WIRE BONDING APPARATUS

FIELD OF THE INVENTION

The invention relates to bond heads for bonding apparatus, for example a wire bond head for bonding a wire to a bonding surface, and in particular to a bond head having multiple actuators.

BACKGROUND

In a wire bonding process, electrically conductive wires are bonded between electrical bonding pads found on electronic devices, such as between a semiconductor die and a substrate onto which the die is attached. The substrate is usually a semiconductor lead frame. The electrical connection could also be made between bonding pads found on separate semiconductor dice. The bond is formed by a bonding tool which may be in the form of a capillary attached to an ultrasonic transducer for generating ultrasonic energy to the capillary tip.

In wire bonders for making so-called "ball-bonds", a bond head which carries the bonding tool is designed to execute a rocking motion about a suitably located pivot. For ultrasonic bonding, the bonding tool is an ultrasonic transducer mounted onto the bond head, the ultrasonic transducer comprising a piezoelectric driver stack coupled to a horn, and a capillary at an end of the horn. Bonding wire, which is typically made of gold, aluminum or copper, is fed from a spool of bonding wire through a hole in the capillary to the tip of the capillary. Bonding is done by welding the wire at the tip of the capillary to the bonding pad through the application of ultrasonic energy to the capillary tip.

Over the years, the operational speed of wire bonding machines has increased considerably, with the result that the bond head needs to be actuated at high speeds while exerting controlled force on the wire being clamped without damaging the wire.

FIGS. 1A to 1C illustrate an example of a prior art bond head 100. FIG. 1A shows a side view, FIG. 1B shows a top view (omitting a wire clamp and a transducer to improve clarity) and FIG. 1C shows a perspective view. The bond head 100 generally comprises a bond head body 102, a wire clamp 104 fixed to the body 102 and a transducer 106 mounted to the bond head 100.

Bonding wire (not shown) is fed from a spool of wire (not shown), and is relayed past the jaws of the wire clamp 104 and threaded through a hole in the transducer 106. The wire clamp 104 is arranged along the path of the bonding wire so as to control feeding of the wire to the transducer 106.

The bond head body 102 is pivoted at a pivot point 112 for turning motion, and turning movement of the bond head body 102 about the pivot point 112 is actuated by an actuator 114 housed within a housing structure 105. The actuator 114 may comprise a voice coil motor including a coil that is movable relative to a magnet by way of electromagnetic interaction when current flows through the coil under the control of a controller (not shown). When actuated by the actuator 114 along a turning arc 115, the bond head body 102 is driven to turn along a turning arc 116. Bonding wire is drawn from the spool of wire towards a bonding location when the wire clamp 104 is closed, and the bond head body 102 is turned away from the spool of bonding wire. The wire clamp 104 may further be opened and the bond head body 102 turned towards the spool in order to position the wire clamp 104 to clamp and draw more bonding wire.

During a bonding cycle and before starting to weld the first bond, a molten ball is formed at a tail end of the bonding wire protruding from the transducer 106. The molten ball is later lowered onto a bonding pad (not shown) to form a first ball bond. The molten ball is formed at the end of this protruding bonding wire by melting the wire through electro-sparking, so a sufficient length of wire must be available at the tail end of the bonding wire to do so. An electronic flame-off ("EFO") device (not shown) creates an electrical spark and melts the wire to form the molten ball.

To leave a tail of bonding wire protruding from the transducer 106 after completion of a bond, the bond head body 102 has to follow a variety of programmed motions under the control of the controller. More specifically, during ball-bonding processes, the bond head body 102 needs to move up a short distance with the wire clamp 104 open after the bonding wire has been welded at a second bond location to complete a wire connection. Then, the bond head body 102 stops and the wire clamp 104 is closed to clamp the bonding wire. After that, the bond head body 102 moves up further to a higher position. During this further upward motion, the bonding wire is pulled up and broken at the second bond location, and gets ready for the start of the first bond of the next wire connection. This is called tail formation, to ensure that a predetermined length of bonding wire protrudes from the transducer 106 after each wire connection is established. The consistency of the length and linearity of the protruding wire determines the repeatability of ball formation and the ball size formed.

However, when trying to perform bonding more quickly and accurately, the bond head 100 has a number of drawbacks. One drawback is that controlling the motion of the bond head body 102 becomes much more difficult when the bond head 100 moves at very high speeds and acceleration. The speed and acceleration of the bond head 100 is also very demanding on its structural stability. The bond head 100 is also susceptible to temperature variations which affect the formation and positioning of bonding wires. This makes it is difficult to accurately produce and position consistently straight tails with uniform lengths at high speed. It would be beneficial to perform bonding more quickly and accurately as compared to the prior art.

SUMMARY OF THE INVENTION

It is thus an object of this invention to seek to provide a bond head of a bonding apparatus which overcomes at least some of the aforementioned problems of the prior art.

According to a first aspect of the present invention, there is provided a bond head for bonding a wire to a bonding surface, comprising: a bond head body movably retained by a mounting portion; a first actuator; and a second actuator, wherein the bond head body has a tool portion configured to receive a bonding tool for receiving and bonding the wire and an actuator portion coupled with the first actuator and the second actuator, the first actuator and the second actuator being operative to act on the actuator portion for moving the bond head body with respect to the mounting portion to move the bonding tool with respect to the bonding surface.

The first aspect recognizes that a problem with existing bond heads is that they typically utilize a single actuator for moving the bond head body. Using a single actuator reduces the level of control over the movement of the bond head body and affects the structural integrity of the bond head body. Also, the increase in size of a single actuator arrangement when needing to generate higher forces to provide for increased acceleration can lead to unacceptable inertia and structural instability.

Accordingly, a bond head is provided. The bond head may bond or fix a wire to a bonding surface. The bond head may comprise a bond head body or member. The bond head body may be operative or configured to move or displace about or on a mounting portion. The bond head may comprise a first actuator. The bond head may comprise a second actuator. The bond head body may have a tool portion. The tool portion may be configured or adapted to receive a bonding tool which receives and bonds the wire to the bonding surface. The bond head body may also have an actuator portion. The actuator portion may be coupled or connected with the first actuator. The actuator portion may be coupled or connected with the second actuator. The first actuator and the second actuator may be operative or configured to act together on the actuator portion. The action of the first actuator and the second actuator on the actuator portion may move or displace the bond head body about the actuator portion. Movement of the bond head may move or displace the bonding tool in relation to the bonding surface. In this way, both the first actuator and the second actuator can be used to move the bond head body, which provides for greater control of the forces generated on the bond head body, can provide for reduced inertia and the arrangement of two actuators can help improve structural stability compared to an equivalent single actuator arrangement.

In one embodiment, the first actuator is operative to generate a first force on the actuator portion and the second actuator is operative to generate a second force on the actuator portion. Accordingly, the first actuator may be configured or arranged to generate a first force on the actuator portion while the second actuator may be configured or arranged to generate a second force on the actuator portion. Accordingly, each actuator may generate an independent or separate force which acts on the actuator portion in order to provide an urging force on the bond head body.

In one embodiment, the bond head comprises actuation logic operative to generate a first signal to energise the first actuator to generate the first force and to generate a second signal to energise the second actuator to generate the second force. Accordingly, the actuation logic or controller may be configured or arranged to generate signals which energize or operate the actuators in order to control the generation of the forces.

In one embodiment, the actuator portion is configured to receive the first force and the second force and be urged in a direction due to a resultant force comprising a combination of the first force and the second force. Accordingly, the actuator portion may be coupled or connected with the actuators so that the forces generated by the actuators together bear on the actuator portion. The actuator may be moved or urged in a direction by a resultant force which arises due to the combined forces of the actuators.

In one embodiment, the first actuator and the second actuator are operative to generate the first force and the second force with equal magnitudes. Accordingly, the actuators may generate forces having the same amplitude or size.

In one embodiment, the first actuator and the second actuator are operative to generate the first force and the second force with unequal magnitudes. Accordingly, the actuators may generate forces having differing amplitudes or sizes.

In one embodiment, the first actuator and the second actuator are operative to generate the first force and the second force to act in a common direction. Accordingly, the actuators may be coupled or connected with the actuator portion and operated to convey the forces on to the actuator portion in the same direction.

In one embodiment, the first actuator and the second actuator are operative to generate the first force and the second force to act in differing directions. Accordingly, the actuators may be coupled or connected with the actuator portion and operated to convey forces on the actuator portion in non-parallel or divergent directions.

In one embodiment, the first actuator and the second actuator are operative to generate the first force and the second force to act in opposing directions. Accordingly, the actuators may be coupled or connected with the actuator portion and operated to impart the forces on the actuator portion in opposing or contrary directions.

In one embodiment, at least one of the first actuator and the second actuator are operative to generate at least one of the first force and the second force with at least one of a time-varying magnitude and direction. Accordingly, either or both of the actuators may generate forces whose magnitude and/or direction changes with time.

In one embodiment, the actuation portion is operative to combine the first force and the second force to generate the resultant force having at least one of a time-varying magnitude and direction. Accordingly, the actuation portion may be acted upon by the actuators and exhibit a resultant force whose magnitude and/or direction varies with time.

In one embodiment, the first actuator and the second actuator are operative to generate the first force and the second force having equal magnitudes and acting in opposing directions to combine to produce a null resultant force. Accordingly, the actuators may be operated or configured to generate matching opposing forces in order that zero resultant force is experienced by the actuation portion. This enables the actuators to be driven without causing a resultant urging of the actuation portion, which will remain in position. This enables the bond head to be maintained at its normal operating temperature due to the operation of the actuators while avoiding movement of the bond head and instead retaining it in an idle position.

In one embodiment, the first actuator and the second actuator each comprises a motor.

In one embodiment, the motor comprises at least one of a voice coil motor, a linear motor, a piezoelectric motor and a pneumatic motor.

In one embodiment, the first actuator and the second actuator are collocated by the actuator portion. Accordingly, the actuators may be located or positioned together by the actuator portion.

In one embodiment, the first actuator is spaced apart from but connected to the second actuator by the actuator portion. Spacing or positioning the actuators apart or away from each other helps to improve the structural stiffness of the bond head body.

In one embodiment, the first actuator and the second actuator are both located for concurrent movement with the actuator portion. Accordingly, the connection between the actuator portion and the actuators may result in the actuators both moving together with the actuator portion.

In one embodiment, the actuator portion has a first housing portion which receives a first moveable component of the first actuator and a second housing portion which receives a second moveable component of the second actuator. Accordingly, the actuator portion may receive or house the moveable components of the actuators.

In one embodiment, the first moveable component of the first actuator is located in a fixed relationship with respect to the second moveable component of the second actuator by the actuator portion. Accordingly, the moveable component of the first actuator may be connected to the actuator portion which is in turn connected to the moveable component of the second actuator.

In one embodiment, movement of the actuator portion causes a corresponding movement of both of the first moveable component of the first actuator and the second moveable component of the second actuator. Accordingly, the moveable portions may move together with the actuator portion.

In one embodiment, the first housing portion is located away from the second housing portion.

In one embodiment, the actuator portion comprises at least one brace extended between the first housing portion and the second housing portion. Providing a brace or strut between the housing portions improves the structural rigidity of the bond head body.

In one embodiment, a first fixed component of the first actuator is located in a fixed relationship with respect to a second fixed component of the second actuator.

In one embodiment, the first fixed component and the second fixed component are located in a fixed relationship with respect to the mounting portion. Accordingly, the fixed components of the actuators may both be coupled with or connected to the mounting portion.

In one embodiment, the first moveable component of the first actuator comprises a first coil and the second moveable component of the second actuator comprises a second coil. A dual core arrangement provides a number of advantages. To produce a particular amount of force, the size of the dual coils can be smaller than the size of an equivalent single coil able to produce that force. This makes the bond head body more compact and can move the centre of gravity of the coils closer to the centre of gravity of the bond head body, which reduces its inertia. Also, the cooling efficiency of dual coils is improved due to the larger heat dissipating area of the two coils compared to a single coil. Also, the coils can be located to improve the stiffness of the bond head body.

In one embodiment, the first fixed component of the first actuator and the second fixed component of the second actuator each comprise a magnet array.

In one embodiment, the magnet array is located to provide a magnetic field extending axially through the first coil and the second coil.

In one embodiment, the magnet array comprises a first magnet array located proximate a first axial face of the first coil and second magnet array located proximate a second axial face of the second coil.

In one embodiment, the first axial face faces away from the second axial face. Accordingly, the faces may be orientated towards different directions.

In one embodiment, the magnet array comprises an intermediate magnet array located between the first coil and the second coil. Accordingly, a third magnet array may be positioned between the first and second magnet array.

In one embodiment, the actuator portion is located in a fixed relationship with the tool portion. Accordingly, the actuator portion may be fixed to the tool portion.

In one embodiment, movement of the actuator portion causes a corresponding movement of the tool portion. Accordingly, the actuator portion and tool portion may move together.

In one embodiment, the bond head body is pivotally received by the mounting portion. Accordingly, the bond head body may rotate on the mounting portion about a pivot.

In one embodiment, the bond head body is pivotally received by the mounting portion about a turning axis.

In one embodiment, movement of the actuator portion in an actuation movement arc about the turning axis causes a corresponding movement of the tool portion in a tool movement arc about the turning axis. The movement arcs may be concentric.

According to a second aspect, there is provided a method of moving a bond head for bonding a wire to a bonding surface, the method comprising the steps of: movably retaining a bond head body on a mounting portion, the bond head body having an actuator portion and a tool portion configured to receive a bonding tool for receiving and bonding the wire; coupling a first actuator and a second actuator with the actuator portion; and actuating the first actuator and the second actuator to move the bond head body with respect to the mounting portion to move the bonding tool with respect to the bonding surface.

In one embodiment, the actuation comprises generating a first force on the actuator portion with the first actuator and generating a second force on the actuator portion with the second actuator.

In one embodiment, the method comprises the step of generating a first signal to energise the first actuator to generate the first force and to generating a second signal to energise the second actuator to generate the second force.

In one embodiment, the method comprises the step of urging the actuator portion in a direction due to a resultant force comprising a combination of the first force and the second force received by the actuator portion.

In one embodiment, the method comprises the step of generating the first force and the second force with equal magnitudes.

In one embodiment, the method comprises the step of generating the first force and the second force with unequal magnitudes.

In one embodiment, the method comprises the step of generating the first force and the second force to act in a common direction.

In one embodiment, the method comprises the step of generating the first force and the second force to act in differing directions.

In one embodiment, the method comprises the step of generating the first force and the second force to act in opposing directions.

In one embodiment, the method comprises the step of generating at least one of the first force and the second force with at least one of a time-varying magnitude and direction.

In one embodiment, the method comprises the step of generating at least one of the first force and the second force to provide the resultant force with at least one of a time-varying magnitude and direction.

In one embodiment, the method comprises the step of generating the first force and the second force with equal magnitudes and acting in opposing directions to combine to produce a null resultant force.

In one embodiment, the first actuator and the second actuator each comprises a motor.

In one embodiment, the motor comprises at least one of a voice coil motor, a linear motor, a piezoelectric motor and a pneumatic motor.

In one embodiment, the method comprises the step of collocating the first actuator and the second actuator with the actuator portion.

In one embodiment, the method comprises the step of connecting the first actuator and the second actuator to the actuator portion to space the first actuator apart from the second actuator by the actuator portion.

In one embodiment, the method comprises the step of locating the first actuator and the second actuator for concurrent movement with the actuator portion.

In one embodiment, the method comprises the step of receiving a first moveable component of the first actuator with a first housing portion of the actuator portion and a second moveable component of the second actuator with a second housing portion of the actuator portion.

In one embodiment, the method comprises the step of locating the first moveable component of the first actuator in a fixed relationship with respect to the second moveable component of the second actuator by the actuator portion.

In one embodiment, the method comprises the step of moving the actuator portion to cause a corresponding movement of both of the first moveable component of the first actuator and the second moveable component of the second actuator.

In one embodiment, the method comprises the step of locating the first housing portion away from the second housing portion.

In one embodiment, the method comprises the step of providing at least one brace extended between the first housing portion and the second housing portion.

In one embodiment, the method comprises the step of locating a first fixed component of the first actuator in a fixed relationship with respect to a second fixed component of the second actuator.

In one embodiment, the method comprises the step of locating the first fixed component and the second fixed component in a fixed relationship with respect to the mounting portion.

In one embodiment, the first moveable component of the first actuator comprises a first coil and the second moveable component of the second actuator comprises a second coil.

In one embodiment, the first fixed component of the first actuator and the second fixed component of the second actuator each comprise a magnet array.

In one embodiment, the method comprises the step of locating the magnet array to provide a magnetic field extending axially through the first coil and the second coil.

In one embodiment, the magnet array comprises a first magnet array and a second magnet array and the method comprises the step of locating the first magnet array proximate a first axial face of the first coil and the second magnet array proximate a second axial face of the second coil.

In one embodiment, the first axial face faces away from the second axial face.

In one embodiment, the magnet array comprises an intermediate magnet array and the method comprises the step of locating the intermediate magnet array between the first coil and the second coil.

In one embodiment, the method comprises the step of locating the actuator portion in a fixed relationship with the tool portion.

In one embodiment, the method comprises the step of moving the actuator portion to cause a corresponding movement of the tool portion.

In one embodiment, the method comprises the step of pivotally receiving the bond head body by the mounting portion.

In one embodiment, the method comprises the step of pivotally receiving the bond head body received by the mounting portion about a turning axis.

In one embodiment, the method comprises the step of moving the actuator portion in an actuation movement arc about the turning axis to cause a corresponding movement of the tool portion in a tool movement arc about the turning axis.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments of the invention in any more detail, an overview will first be provided. Embodiments provide an actuation mechanism which may be used by, for example, a bond head or other apparatus which requires improved actuation control. The actuator mechanism has more than one actuator, which are coupled to act together on the bond head. Having more than one actuator provides for increased control over the forces generated to move the bond head. Also, having more than one actuator provides structural advantages since each actuator can be smaller than an equivalent single actuator and the actuators couple with the bond head at different locations to improve structural rigidity. Furthermore, the actuators can be operated to generate cancelling forces to avoid changes in the operating of the bond head when transitioning to a stationary or inactive state.

Bond Head

Figure 1A:
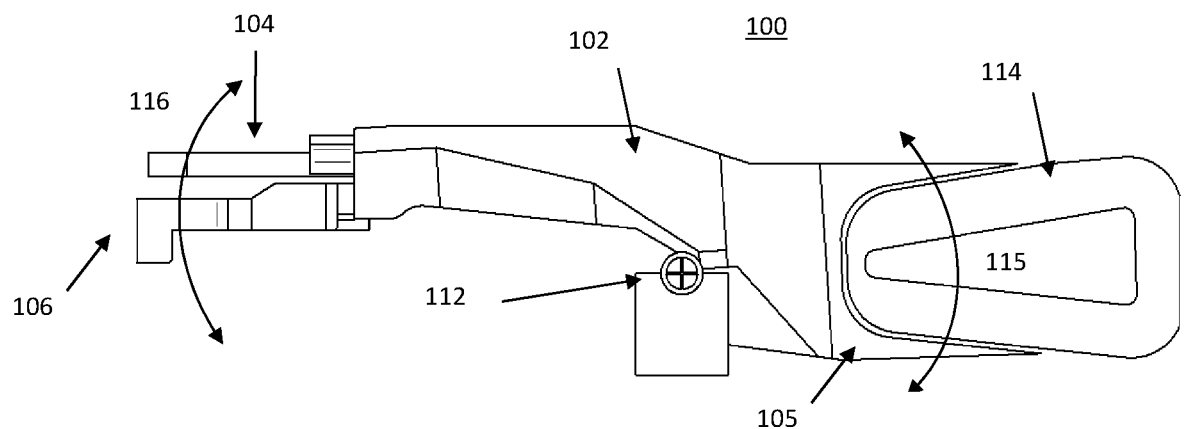
FIGS. 1A to 1C illustrate an example of a prior art bond head.
Figure 1B:
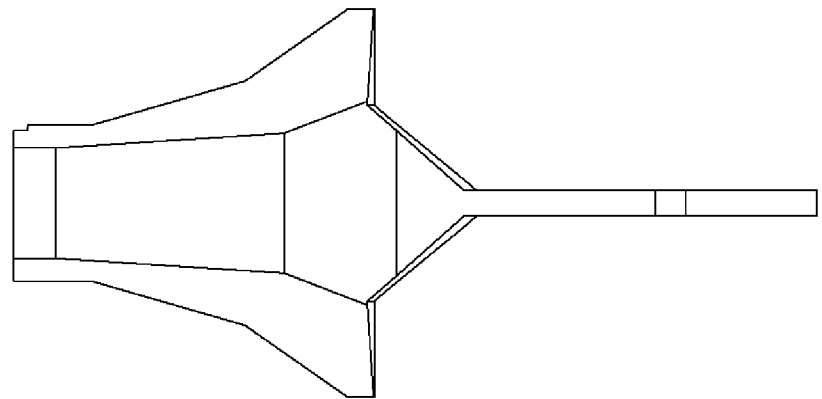
Figure 1C:
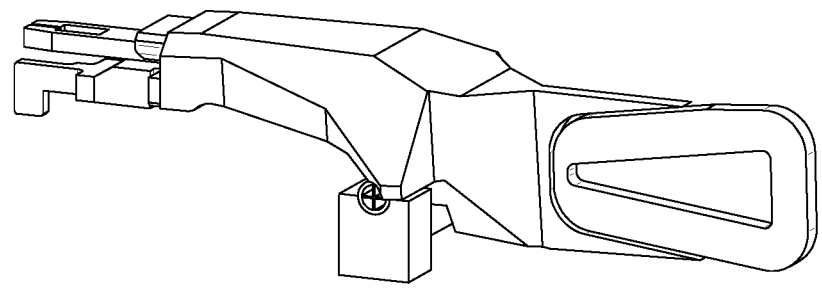
Figure 2A:
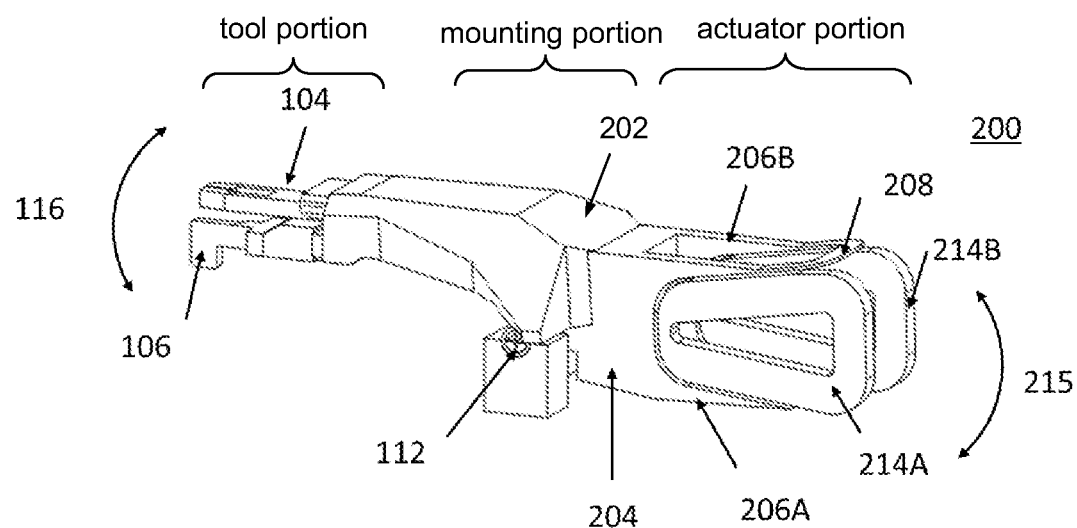
FIGS. 2A and 2B illustrate a bond head of one embodiment.
Figure 2B:
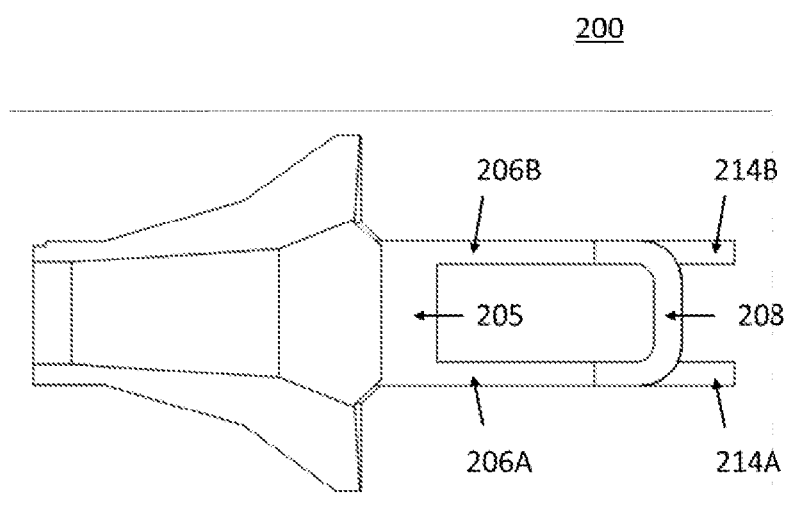

FIGS. 2A and 2B illustrate a bond head 200 of a bonding apparatus according to one embodiment. FIG. 2A shows a perspective view and FIG. 2B shows a top view (omitting a wire clamp and a transducer to improve clarity). The arrangement and configuration of the bond head body 202 is identical to the arrangement mentioned above, with the exception of the provision of dual coils 214A; 214B and a dual actuator housing structure 204.

The dual actuator housing structure 204 comprises a lateral component 205 which extends in an axial direction of the pivot 112 and has two flange structures 206A, 206B which extend transversely to the lateral component 205, away from the pivot 112 in a radial direction. The two flange structures 206A, 206B have recesses shaped to receive a corresponding coil 214A, 214B. The extended connection of the dual actuator housing structure 204 to the rest of the bond head body 202 along the axial direction of the pivot 112 helps to improve the stiffness of the bonding head which helps to improve its performance in operation.

The coils 214A, 214B are held by the two flange structures 206A, 206B so that they extend away from the pivot 112 radially, with their major faces orientated to be generally parallel. The coils 214A, 214B are spaced apart by the two flange structures 206A, 206B to provide a void to receive a magnet array (not shown), as will be explained in more detail below.

The dual actuator housing structure 204 has a bracing strut 208 extending between the flange structures 206A and 206B in order to further improve its rigidity which helps to improve its performance in operation.

The bond head body 202 may be formed of component parts connected together or may be formed from a unitary component where the parts move together or in tandem. In either case, forces generated by either coil 214A, 214B are conveyed to its flange structure 206A, 206B and are received by the dual actuator housing structure 204 with the resultant force acting to move the bond head body 202 about the pivot 112.

Figure 3:
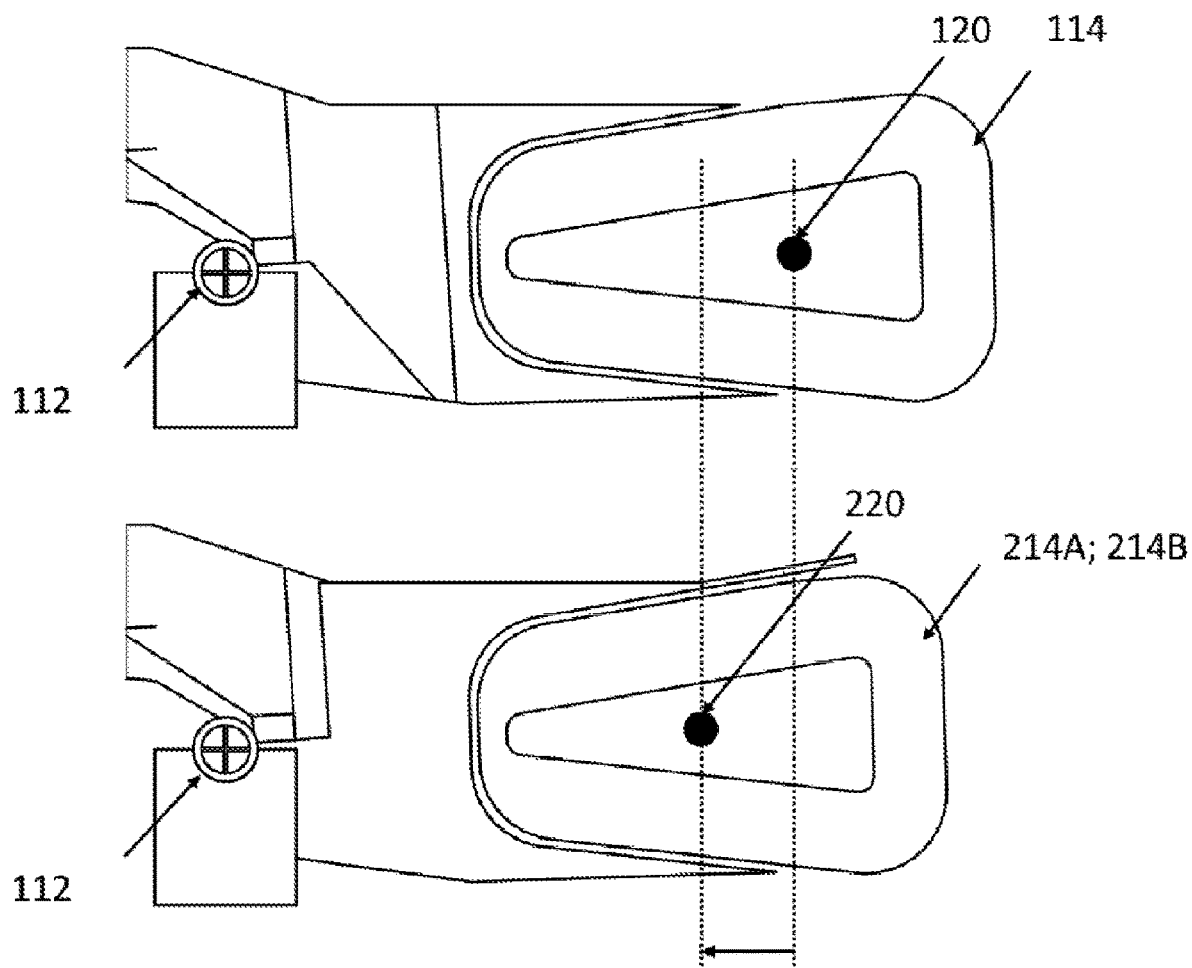
FIG. 3 illustrates relative sizes and centres of gravity of actuator coils.

As illustrated in FIG. 3, in order to generate a predetermined amount of force, the size of a single coil 114 required to generate that amount of force is larger than the size of a pair of coils 214A, 214B operating together to generate the same amount of force. The smaller size of the coils 214A, 214B locates the centre of gravity 220 of the pair of coils 214A, 214B closer to the pivot 112, compared to the centre of gravity 120 of the single coil 114. Placing the centre of gravity 220 closer to the pivot 112 reduces motor inertia. In one exemplary arrangement, the inertia of the equivalent single coil is 47% higher than that of a dual coil and the natural frequency of the equivalent single coil is 550 Hz lower than that of a dual coil.

Figure 4:
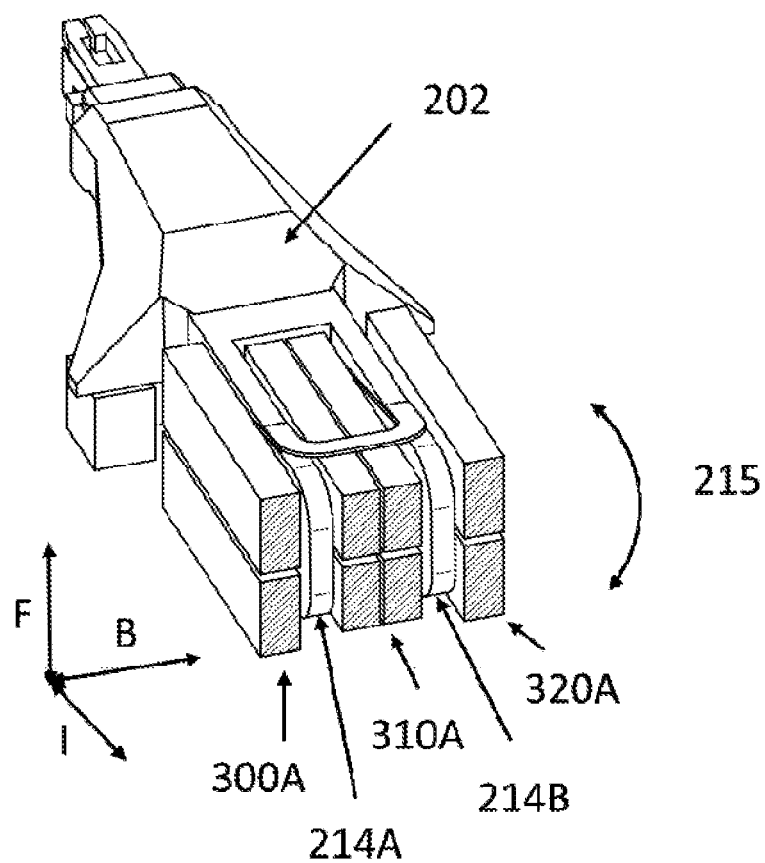
FIG. 4 illustrates the arrangement of the bond head body with a magnet array of one embodiment.

FIG. 4 illustrates the arrangement of the bond head body 202 with a magnet array. The magnet array remains in a fixed position during operation of the bond head 200 when the bond head body 202 rotates about the pivot 112. The magnet array comprises a first magnet stack 300A adjacent one major face of the coil 214A and a second magnet stack 310A provided adjacent another major face of the coil 214A. This generates a magnetic field extending generally in the direction B, which is generally parallel to the axis of the pivot 112, with magnetic flux flowing perpendicularly through to major faces of the coil 214A. As current flows through the coil 214A in the direction I, a force is generated, generally in the direction F, which causes the bond head body 202 to pivot about the pivot 112, following the turning arc 215.

The second magnet stack 310A is located adjacent one major face of the coil 214B and a third magnet stack 320A is provided adjacent another major face of the coil 214B. This generates a magnetic field extending generally in the direction B, which is generally parallel to the axis of the pivot 112, with magnetic flux flowing perpendicularly through to major faces of the coil 214B. As current flows through the coil 214B in the direction I, a force is generated, generally in the direction F, which causes the bond head body 202 to pivot about the pivot 112, following the turning arc 215.

The arrangement of the dual coils 214A, 214B is more efficient due to its double layer magnet array design which provides for larger magnetic density, and so the coils themselves can be smaller. Also, the cooling efficiency of the dual coil arrangement is higher due to a larger heat-dissipating area.

Figure 5:
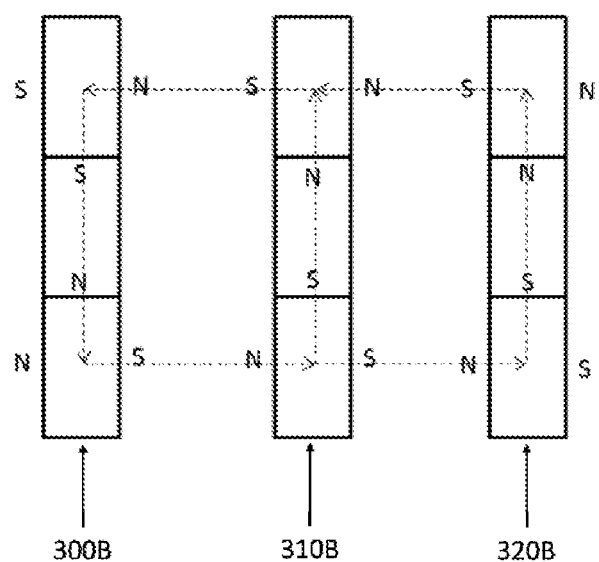
FIG. 5 illustrates a magnet array of another embodiment.

FIG. 5 illustrates an alternative magnet array where each magnetic stack 300B, 310B, 320B is formed from three magnets whose polarities are arranged as indicated. In particular, the outer magnets in each of the magnet stacks 300B, 310B, 320B have their polarities orientated to be generally parallel to the axis of the pivot 112 while the inner magnet in each stack 300B, 310B, 320B has its polarity orientated perpendicularly in the direction of the magnet stack. This provides for magnetic flux lines formed into a more rectangular shape to pass transversely through the major lengths of the coils 214A, 214B.

Figure 6:
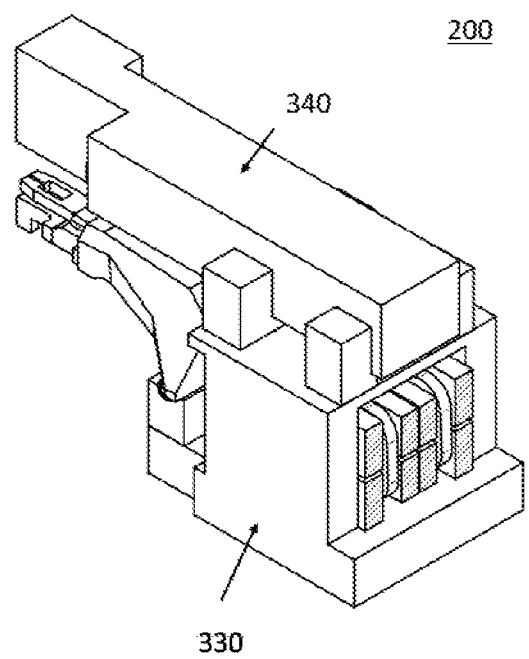
FIG. 6 shows the bond head with its magnet array together with housings of one embodiment.

FIG. 6 shows the bond head 200 with its magnet array 300A, 310A, 320A retained by its housing 330 and an upper housing 340 which houses optics and other control circuitry which provide driving currents and feedback during operation of the bond head 200.

Bond Head Operation

Figure 7A:
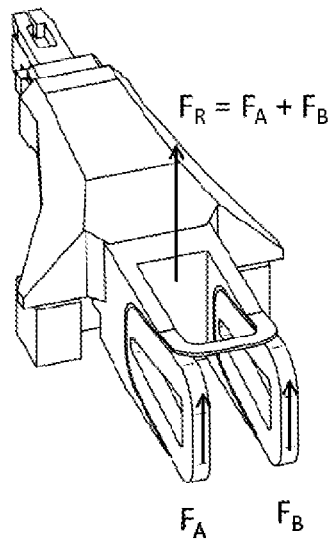
FIGS. 7A and 7B illustrate exemplary forces generated during operation of the bond head of one embodiment.
Figure 7B:
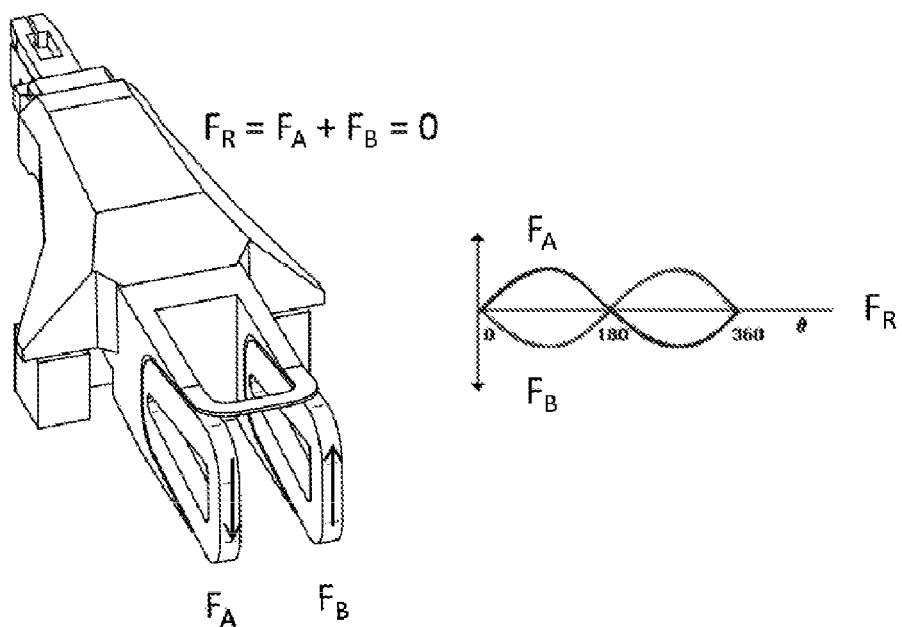

FIGS. 7A and 7B illustrate exemplary forces generated during operation of the bond head 200. As can be seen in FIG. 7A, assuming that when the coils 214A, 214B are energized with identical currents flowing in a specified direction, the coils 214A, 214B generate identical forces $F_A$, $F_B$ operating in identical directions. The magnitude of the forces $F_A$, $F_B$ can be varied by varying the magnitude of the current. The direction of the forces $F_A$, $F_B$ can be varied by varying the direction of the current. This differential force generation provides for improved control of the bond head body 202. The forces $F_A$, $F_B$ generated by the coils 214A, 214B act together on the dual actuator housing structure 204 with the combined, resultant force $F_R$ acting on the bond head body 202. Hence, it will be appreciated that the coils 214A, 214B may be driven with non-identical currents and/or with currents operating in opposing directions in order to vary the amount of resultant force $F_R$ experienced by the bond head 200 to provide flexible force configurations such as, for example high accelerating or decelerating forces, fine bonding force, or the like.

As illustrated in FIG. 7B, in one mode of operation, the coils 214A, 214B are driven with currents of equal and opposite magnitudes in order to generate equal and opposite forces $F_A$, $F_B$ so that current flowing through the coils may maintain thermal stability of the bond head 200. In other words, currents with opposite phases can be provided to the two coils 214A, 214B respectively to generate heat while the bond head 200 is in an idle state. As the forces $F_A$, $F_B$ generated by each coil counter-balance each other, the resultant force $F_R$ has a zero value and the bond head 200 would stay still. This helps the bond head 200 to maintain thermal stability during idle periods.

Although the present invention has been described in considerable detail with reference to certain embodiments, other embodiments are possible.

Therefore, the spirit and scope of the appended claims should not be limited to the description of the embodiments contained herein.

The invention claimed is:

1. A bond head for bonding a wire to a bonding surface, comprising:
    a bond head body movably retained by a mounting portion about a pivot having a pivot axis;
    a first actuator comprising a first coil positioned between first and second magnet stacks, wherein at least one of the first and second magnet stacks comprises a plurality of magnets; and
    a second actuator comprising a second coil positioned between the second magnet stack and a third magnet stack;
    wherein said bond head body has
    a tool portion configured to receive a bonding tool for receiving and bonding said wire and an actuator portion coupled with said first actuator and said second actuator, said first actuator and said second actuator being operative to act on said actuator portion for driving said bond head body to rotate about the pivot axis with respect to said mounting portion to move said bonding tool in reciprocating directions toward and away from said bonding surface, the first and second coils being spaced from each other in a direction that is parallel to an axial direction of the pivot axis.

2. The bond head of claim 1, wherein said first actuator is operative to generate a first force on said actuator portion and said second actuator is operative to generate a second force on said actuator portion.

3. The bond head of claim 2, wherein said actuator portion is configured to receive said first force and said second force and be urged in a direction due to a resultant force comprising a combination of said first force and said second force.

4. The bond head of claim 2, wherein said first actuator and said second actuator are operative to generate said first force and said second force with one of equal and unequal magnitudes.

5. The bond head of claim 2, wherein said first actuator and said second actuator are operative to generate said first force and said second force to act in one of a common and differing directions.

6. The bond head of claim 2, wherein at least one of said first actuator and said second actuator are operative to generate at least one of said first force and said second force with at least one of a time-varying magnitude and direction.

7. The bond head of claim 3, wherein said actuation portion is configured to combine said first force and said second force to generate said resultant force having at least one of a time-varying magnitude and direction.

8. The bond head of claim 2, wherein said first actuator and said second actuator are operative to generate said first force and said second force having equal magnitudes and acting in opposing directions to combine to produce a null resultant force.

9. The bond head of claim 1, wherein said first actuator and said second actuator each comprises a motor.

10. The bond head of claim 1, wherein said first actuator and said second actuator are collocated by said actuator portion.

11. The bond head of claim 1, wherein said first actuator is spaced apart from but connected to said second actuator by said actuator portion.

12. The bond head of claim 1, wherein said first actuator and said second actuator are both located for concurrent movement with said actuator portion.

13. The bond head of claim 1, wherein said actuator portion has a first housing portion which receives said first coil of said first actuator and a second housing portion which receives said second coil of said second actuator.

14. The bond head of claim 13, wherein said first coil of said first actuator is located in a fixed relationship with respect to said second coil of said second actuator by said actuator portion.

15. The bond head of claim 13, wherein said actuator portion comprises at least one brace extended between said first housing portion and said second housing portion.

16. The bond head of claim 1, wherein said first magnet stack of said first actuator is located in a fixed relationship with respect to said second magnet stack of said second actuator.

17. The bond head of claim 16, wherein said first magnet stack and said second magnet stack are located in a fixed relationship with respect to said mounting portion.

* * * * *